(12) United States Patent
Trop

(10) Patent No.: US 6,353,335 B1
(45) Date of Patent: Mar. 5, 2002

(54) NEGATIVE FEEDBACK, SELF-BIASING PECL RECEIVERS

(75) Inventor: Zeev Trop, Haifa (IL)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/501,385

(22) Filed: Feb. 9, 2000

(51) Int. Cl.[7] .......................................... H03K 19/0175
(52) U.S. Cl. ........................... 326/83; 326/73; 326/81; 327/538; 327/540
(58) Field of Search ........................ 326/83, 16, 73, 326/33, 81; 327/538, 540

(56) References Cited

U.S. PATENT DOCUMENTS

| | | | | |
|---|---|---|---|---|
| 4,763,026 A | * | 8/1988 | Tsen et al. ..................... | 327/56 |
| 4,998,026 A | * | 3/1991 | King ............................ | 326/16 |
| 5,087,834 A | * | 2/1992 | Tsay ............................ | 326/33 |
| 5,495,184 A | * | 2/1996 | Des Rosiers et al. .......... | 326/73 |
| 5,614,843 A | * | 3/1997 | Mita et al. .................... | 326/73 |
| 5,633,602 A | * | 5/1997 | Sanwo et al. ................. | 326/73 |
| 5,666,069 A | * | 9/1997 | Gibbs .......................... | 326/81 |
| 5,963,053 A | * | 10/1999 | Manohar et al. .............. | 326/60 |
| 5,994,923 A | | 11/1999 | Navabl | |

FOREIGN PATENT DOCUMENTS

JP 7297704 A * 11/1995 ................... 326/63

* cited by examiner

Primary Examiner—Michael Tokar
Assistant Examiner—Steven S. Paik
(74) Attorney, Agent, or Firm—Morton Chirnomas

(57) ABSTRACT

A CMOS PECL-rx of the present invention comprises a decision stage, an output buffer; and biasing means for adjusting the tip voltage of the output buffer by negative feedback.

9 Claims, 4 Drawing Sheets

NEGATIVE FEEDBACK, SELF-BIASING PECL RECEIVERS

FIELD AND BACKGROUND OF THE INVENTION

The present invention relates to compensating circuits incorporated into micro-electronic complementary metal-oxide semiconductor (hereinunder "CMOS") integrated circuits ("IC"s), of the type used in Pseudo ☐ Emitter Coupled Logic receivers (hereinafter "PECL-rx"). More particularly, the present invention relates to improvements in the design of the output buffer portion of such circuits which can result in increased production yield and/or lower rejection rate of ICs incorporating these circuits, as well as to ICs incorporating the improvements.

PECL-rx are the subject of various US and other patents, e.g. U.S. Pat. No. 5,963,053 to Amar Manuhar et al., U.S. Pat. No. 5,994,923 to Mohammad J. Navabi.

A known basic PECL-rx circuit comprises three blocks: a pre-amplifier, which will not be referred to any further, a decision stage and an output buffer. The output buffer comprises a Complementary Self-bias Differential Amplifier, hereinbelow a "CSDA". The CSDA comprises two inverters, each inverter comprising one p-type field effect transistor ("transistor" hereinafter) connected in series to one n-type transistor, as is known, The CSDA has one output: $V_{out}$, and two inputs: $+V_0$ and $-V_0$. The values of the inputs $+V_0$, $-V_0$ must be close to the trip point of the CSDAs: $+V_0$ being above the trip point and $-V_0$ below it, and sufficiently far away from their saturation zones.

Experience with PECL-rx IC's shows that it is difficult to obtain a satisfactory yield of IC's incorporating PECL-rx circuits due to the inherent sensitivity of the CSDA to the process. However, a marked increase in yield of acceptable or process adaptive IC's incorporating this invention is achieved.

ICs are complex electronic circuits made on a small, single piece of wafer and are comprised of numerous, microscopic electronic components. The number of components in many ICs which are currently produced can reach many millions on several square cms.

During the IC manufacturing process, several materials are successively applied to the wafer, which is typically several hundreds of microns thick and can be a few hundred mm's in diameter. Many ICs can be manufactured from one wafer either in the form of layers deposited on top of each other, for example, as oxidized layers or surfaces, or as materials selectively applied to parts of the IC wafer. Additionally, portions of these layers may be treated, for example, by making a mask based on the layer design and masking parts of the relevant layer with the specific mask work, then etching, in order to controllably remove some portion of them, thereby leaving a desired pattern of etched layer on top of lower layers. Another process which may be applied to some of the layers is doping. That is the addition into a particular layer's material of low concentrations of other materials which affect the electrical properties of the doped material. The resultant patterns of the various layers, when superimposed on each other, form miniature electric and electronic components such as resistors, capacitors, transistors and the like which together comprise the IC. Variations in any and all of the above steps can introduce variability which can affect the voltage input to the CSDA, thereby affecting the trip point and consequently the CSDA voltage may be out of the desired range.

Several different technologies of IC's exist. According to each one of these technologies, IC's are manufactured from several layers of different materials. Still different materials are used to manufacture each one of the various technologies of IC's. Also, the manufacturing of each one of the different layers of an IC calls for a different technology. Each one of the various ICs technologies offers certain advantages and suffers from some disadvantages. This invention relates to ICs of CMOS ("complementary metal oxide semiconductor") technology and in particular to the production of an improved complementary self-bias differential amplifier which is not sensitive to the process, as are currently known CSDAs.

The factors in the process which can affect the CSDA include all of the nominal physical and chemical properties of the components of the IC, the net effect of these properties, the temperature under which the CSDA is operating, as well as the supply of voltage into the circuit.

Agreed upon testing methods using the corner conditions, to be explained below, are applied which determine the acceptability of an IC. Those ICs that pass the agreed upon tests are considered acceptable, while those which fail are rejected.

Especially in an industry with ever-increasing competition, it is of major economic significance for the IC manufacturer to increase its yield, or the fraction of acceptable ICs out the total number of the produced ICs. Alternatively, the lowering of the fraction of rejects or rejected ICs within a production lot can be economically very rewarding.

SUMMARY OF THE INVENTION

It is one objective of the present invention to provide an additional, auxiliary electronic circuit incorporated into PECL-rx IC's, so that its trip point is adjusted without markedly increasing the IC's complexity.

It is a further objective of the present invention to increase the yield, or the percentage of acceptable ICs incorporating PECL-rx, among the total number produced.

These objectives and others not specifically enumerated are achieved according to this invention by incorporating into the PECL-rx a negative feedback loop comprising an inverter which serves as a correcting circuit.

BRIEF DESCRIPTION OF THE DRAWINGS

The present invention will be better understood and appreciated from the following detailed description taken in conjunction with the drawings in which.

DETAILED DESCRIPTION OF THE INVENTION

The present invention relates to IC circuits incorporating both PECL-rx circuitry and correcting circuit intended to keep the CSDA trip point within its design limits or range. The correcting circuit inverter is called Dummy Trip Inverter, hereinafter "DTI". This correction improves the IC yield, or lowers the IC rejection rate, caused by non-uniformities of the wafer material used for the IC's manufacturing.

Figure 1:
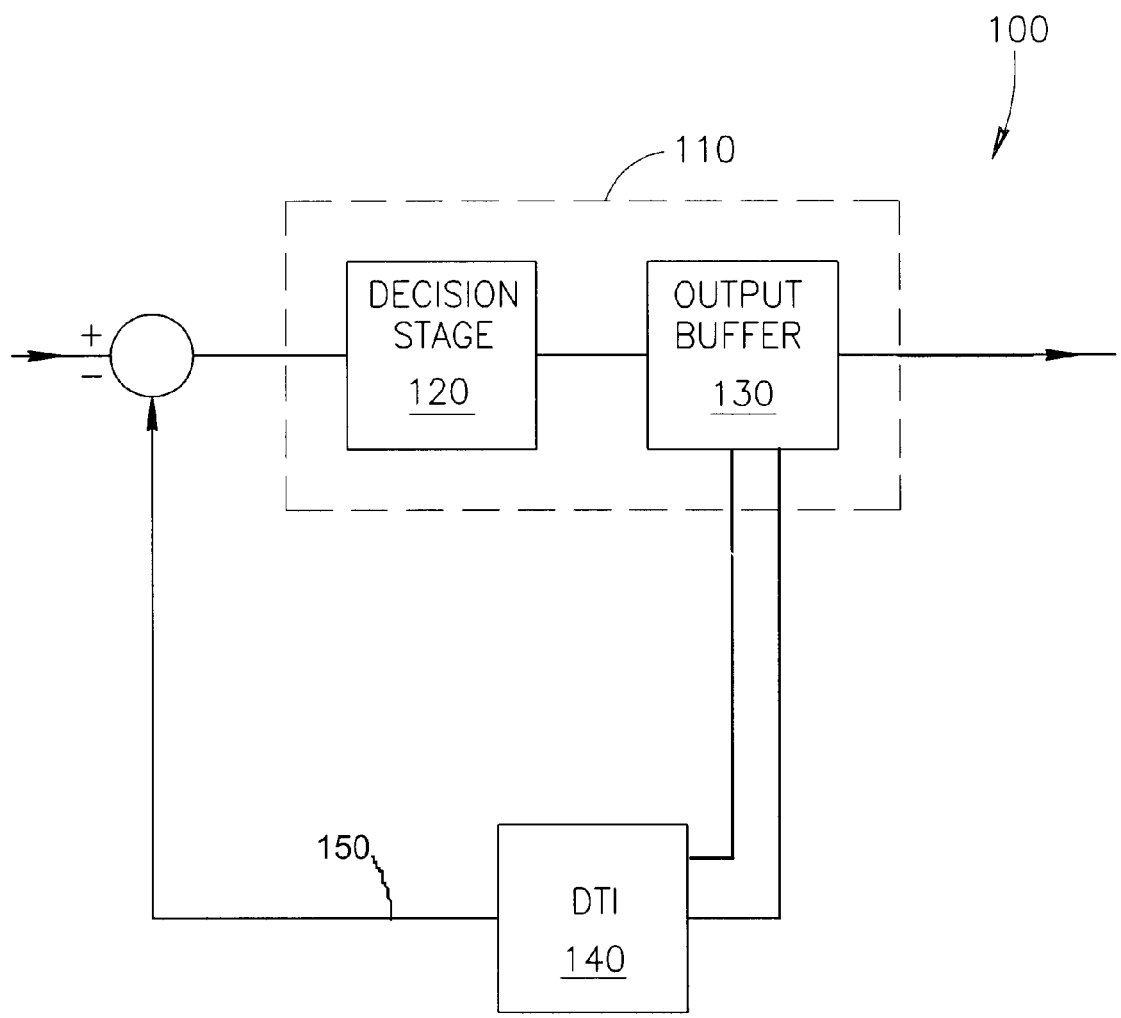
FIG. 1 is basic block diagram according to this invention.

With reference to FIG. 1, a block diagram of a PECL-rx circuit 100 is shown according to the present invention. A conventional design PECL-rx 110 has added thereto a DTI circuit 140.

PECL-rx 110 comprises two blocks:
 a decision stage 120 (also referred to hereinafter as "DS"), and
 an output buffer 130, including a CSDA 129 and two inverters (not shown) incorporated into CSDA 129.

PECL-rx 100 according to the present invention also includes:
 a DTI circuit 140, incorporated into a negative feedback loop 150.

Both a conventionally designed PECL-rx and the PECL-rx of this invention incorporate a CSDA, said CSDA having a voltage trip point whose value should be approximately the average of $+V_0$ and $-V_0$ the two input voltages to the CSDA. The $+V_0$ and $-V_0$ within the PECL-rx circuit are shown further hereinbelow. Especially, the CSDA circuit trip point may not be outside of the range defined by these values. If the trip voltage generated by the CSDA is outside said range, the CSDA will not operate properly. The value of the trip point depends on the IC supply voltage, on the IC temperature and on the process.

Because of the nearly infinite number of conditions which can affect the process outcome, corner conditions, to be explained below, are chosen as it is often impractical to check all of the possible end results of all of the possible combinations of components and include the effects of all of the possible properties, temperature and voltage deviations of each IC.

The nominal supply voltage in this embodiment is 2.5 V. A high supply voltage, 2.75 V in this embodiment, leads to fast circuit responses and this condition is designated as "F". A low supply voltage, 2.25 V in this embodiment, leads to a slow circuit responses and the condition is designated as "S". A low circuit temperature, −40° C. in this embodiment, leads to a fast circuit response, another condition designated as "F", while a high circuit temperature, +125° C. in this embodiment, leads to a slow response, still other condition designated as "S". Each combination of two extreme voltage and temperature values is called a "corner", and is designated by its voltage-temperature "F" and "S" combination. Thus the "FF" corner is a combination of a high voltage and a low temperature, while the reverse holds true for the "SS" corner. As the SS and the FF corner conditions lead to extreme circuit responses and outputs, their simulated results are shown and tabulated below. Also shown are circuit outputs at the nominal voltage and at the room temperature of 27° C., designated "T".

Figure 2:
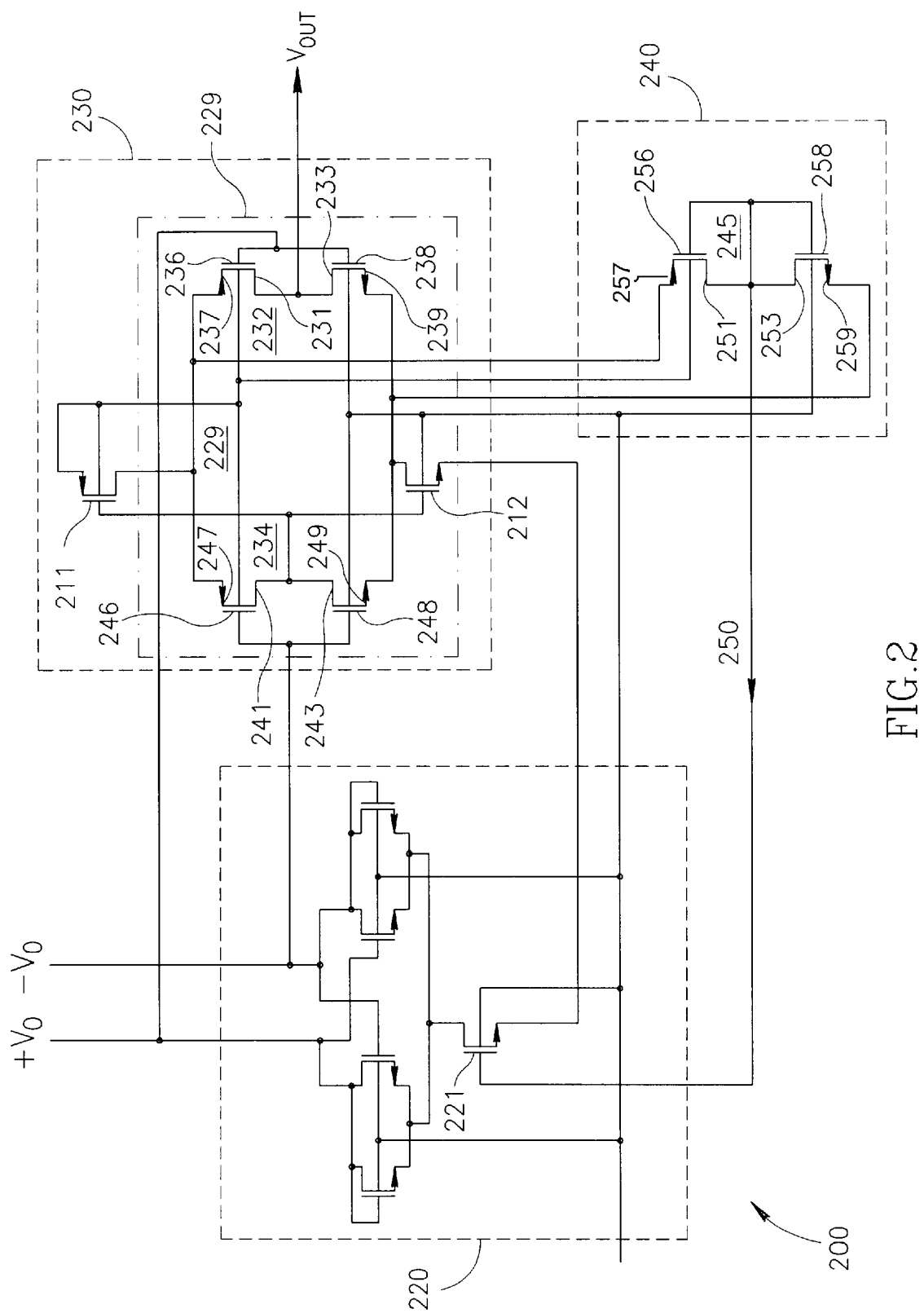
FIG. 2 is a detailed circuitry drawing according to this invention.

With reference now to FIG. 2, there is shown a detailed design of a PECL-rx 200 according to this invention. The reference numbers of like members shown in FIGS. 1 and 2 differ by 100. Inverter 245 used in DTI 240 is similar to two inverters 232 and 234 incorporated into CSDA 229 of PECL-rx output buffer 230, and is located in close proximity to them. Good circuit design practice calls for minimizing of the length of conductors connecting different components, as taught, for example, in Principles of CMOS VLSI Design, by N. Weste and Kamran Eshraghian. As each component measures a few microns, the distance between DTI 240 and CSDA 229 is preferably much less than 0.1 mm, i.e., orders of magnitude below the wafer diameter of several hundred mm.

As the distance between nearby IC components ☐ is very small compared to the wafer large dimension or diameter, it is safe to assume that under these circumstances the wafer electrical properties do not change appreciably along this distance, and that the electrical properties of several closely spaced transistors will be very close to each other. Therefore, both the wafer portion on which output buffer 230 is positioned and the wafer portion on which DTI correcting circuit 240 is positioned have nearly the same wafer properties and nearly the same deviations from the nominal properties. This observation forms the basis of the present invention, wherein a negative feedback loop 260 connects the output of DTI circuit 240 to an input of PECL-rx decision stage 220 that is then output into output buffer 230. By connecting the negative feedback loop 250 to the input of decision stage 220, deviations of the wafer properties or voltage inputs from their nominal specification are compensated for, i.e. there is a resultant change in the trip point, thereby improving production yield with a lower IC rejection rate.

Each one of inverters 232, 234, 245 includes a p-type transistor 238, 246, 256 and an n-type transistor 238, 248, 258, respectively, each transistor having a source terminal 237, 247, 257, 239, 249, 259, respectively, and a drain terminal 231, 241, 251, 233, 243, 253, respectively. Each source terminal of transistors ☐ 256 and 258 is connected to a different input voltage source 237, 239, respectively, and both drain terminals of these transistors are connected together to establish the CSDA output, as is known. Inverters 232, 234, 245, have one common voltage source for the three n-type transistors 238, 248, 258 and another common voltage source for the three p-type transistors 236, 246, 266. The output of DTI 240 is fed into decision stage 220 and adjusts its output, In turn adjusting the outputs of output buffer 230 and of DTI 240.

Figure 3:
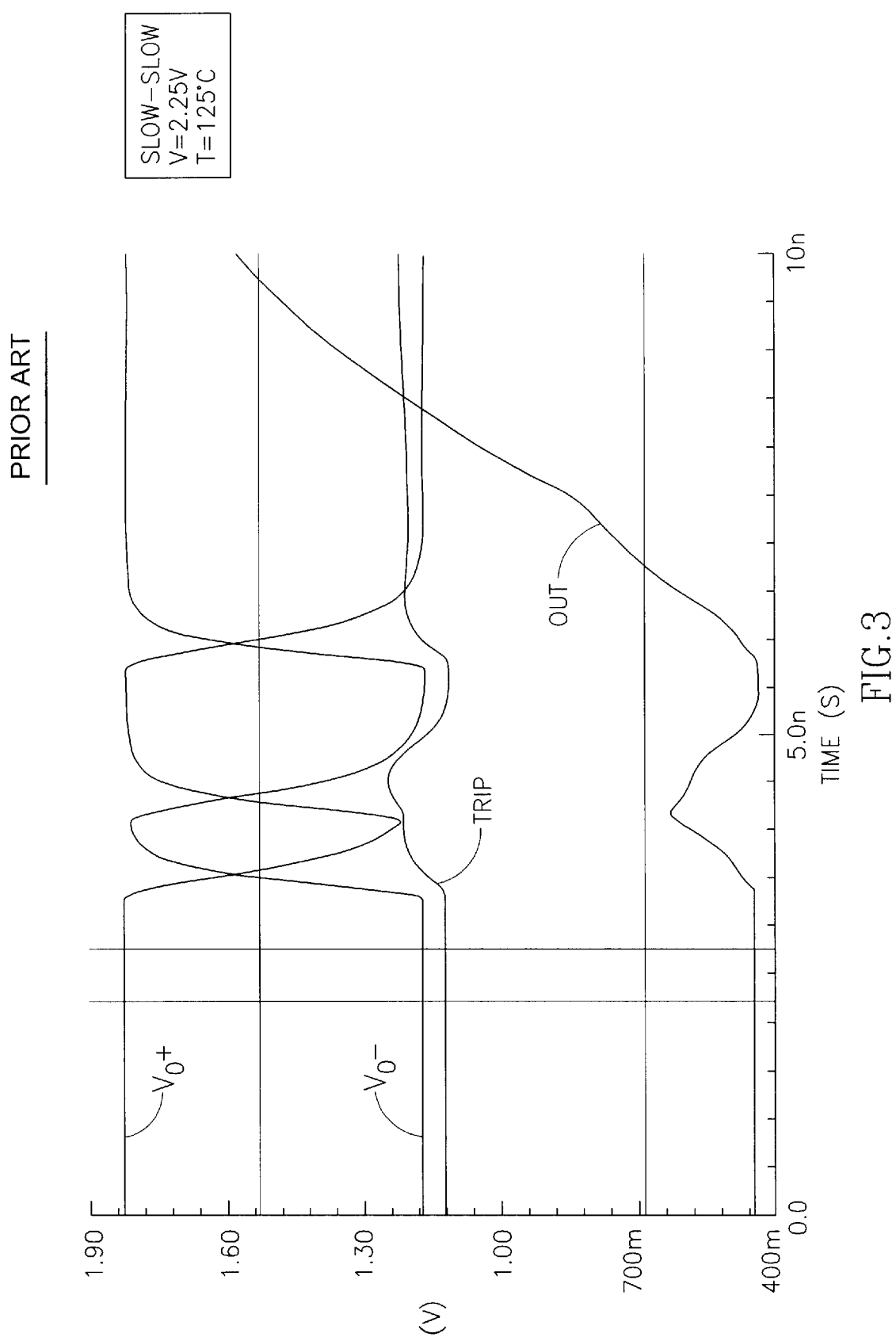
FIG. 3 is a depiction of the dynamic results of a simulation of a conventional design, prior art PECL-rx.
Figure 4:
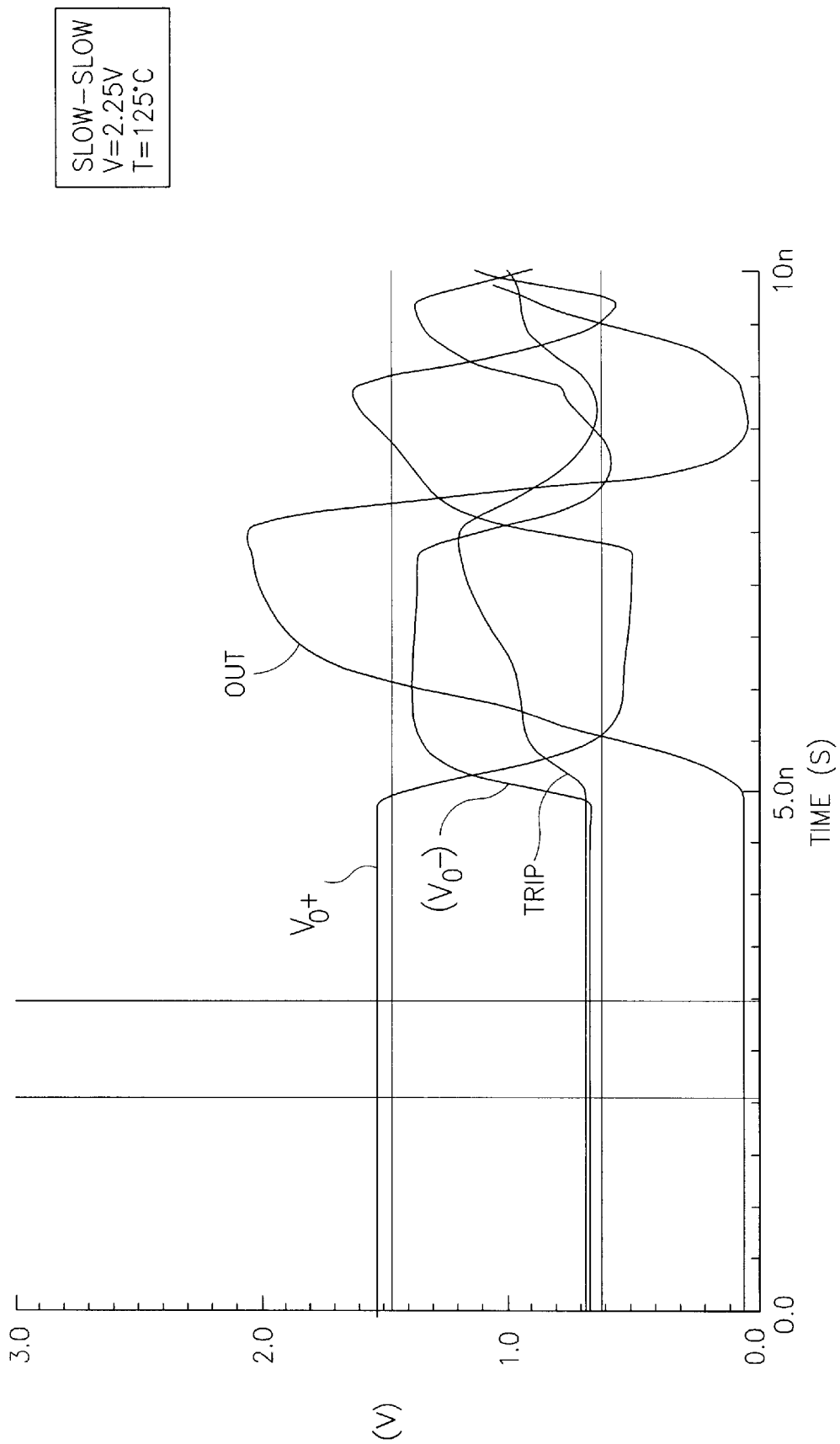
FIG. 4 is a depiction of the dynamic results of a simulation of a PECL-rx according to this invention.

Simulation results are presented for two different CMOS 0.25 micron PECL-rx designs:
 Predicted behavior of $+V_0$, $-V_0$ and of $V_{out}$ of a PECL-rx of the type known in the prior art are shown in FIG. 3 and in Table 1 hereinunder.
 Predicted behavior of $+V_0$, $-V_0$ and of $V_{out}$ of a PECL-rx according to this invention are shown in FIG. 4 and in Table 2 hereinunder.

The defined properties of the transistors used in the simulation are standard transistor properties at the designated voltages and temperatures.

TABLE 1

Simulation results of prior art PEGL-rx

| | Without dummy inverter | | |
|---|---|---|---|
| Parameter Conditions | TT/27° C./ 2.5V | SS/125° C./ 2.25V | FF/−40° C./ 2.75V |
| $+V_0$ | 1.74V | 1.82V | 1.62V |
| $-V_0$ | 0.850V | 1.17V | 0.798V |
| Trip | 1.20V | 1.11V(*) | 0.823V |
| $V_{GS}$ | 0.585V | 0.620V | 0.544V |
| I_Tran_M16 | 196 μA | 157 μA | 256 μA |
| VDS_Tran_M16 | 0.584V | 0.620V | 0.544V |

(*) Out of range, below $-V_0$

TABLE 2

Simulation results of PECL-rx according to this invention

| | With dummy inverter | | |
|---|---|---|---|
| Parameter Conditions | TT/27° C./ 2.5V | SS/125° C./ 2.25V | FF/−40° C./ 2.75V |
| $+V_0$ | 1.47V | 1.53V | 1.3V |
| $-V_0$ | 0.569V | 0.682V | 0.452V |

TABLE 2-continued

Simulation results of PECL-rx according to this invention

| | With dummy inverter | | |
|---|---|---|---|
| Parameter Conditions | TT/27° C./ 2.5V | SS/125° C./ 2.25V | FF/−40° C./ 2.75V |
| Trip | 0.836V | 0.801V | 0.833V |
| $V_{GS}$ | 0.636V | 0.701V | 0.633V |
| I_Tran_M16 | 202 µA | 209 µA | 343 µA |
| VDS_Tran_M16 | 0.324V | 0.074V | 0.053V |

As can be seen from Tables 1 and 2, the changes in the values of $-V_0$, of the trip point of CSDA 239 and of transistor M16 221 current, are significantly higher in the conventionally designed PECL-rx than in the inventive PECL-rx with DTI 240, These results show a particularly marked improvement in the dynamic response of $V_{out}$.

The resultant effect on the signal $-V_0$ in the inventive circuit is decreased because the negative feedback from DTI 240 raises $-V_0$, which, in turn, raises the trip point of CSDA 229. Thus the effect on transistor M16 221 seen in FIG, 2 is that its voltage $V_{GS}$ is raised and both $-V_0$ and $V_{DS}$ are reduced, thus keeping $-V_0$ within narrower limits than those achieved in the prior art PECL-rx.

With reference to FIGS. 3 and 4, the dynamic behavior of these parameters is shown. Simulation results show a yield which increases from 80% for IC's that do not incorporate this invention to about 95% for IC's that incorporate the invention.

It should be understood that the disclosed embodiment is for illustrative purposes only. Various modifications and adaptations will be apparent to those skilled in the art and it will be appreciated that the scope of the present invention should be determined in reference to the claims appended hereto.

What is claimed is:

1. A CMOS PECL-rx having a wide common mode, range comprising:
    a decision stage for determining common mode input, the decision stage receiving an input differential voltage;
    an output buffer connected to said decision stage for receiving said input differential voltage in parallel to the decision stage according to a level of the common mode input determined by said decision stage and for providing an output from said PECL-rx; and
    biasing means connected to said output buffer for receiving differential input from the output buffer for determining the trip point voltage and connected to said decision stage for passing the trip point voltage to the decision stage for the decision stage to determine proper common mode input level of the output buffer.

2. A CMOS PECL-rx in accordance with claim 1, wherein said biasing means is a dummy trip inverter.

3. A CMOS PECL-rx in accordance with claim 2, wherein said dummy trip inverter is connected between said output buffer and said decision stage by a negative feedback loop.

4. A CMOS PECL-rx according to claim 2, wherein said dummy trip inverter comprises an inverter, said inverter having supplies connected in parallel to two complementary self-bias differential inverters.

5. A CMOS PECL-rx according to claim 3, wherein said dummy trip inverter comprises an inverter, said inverter having supplies connected in parallel to two complementary self-bias differential inverters.

6. An integrated circuit including a CMOS PECL-rx having a wide common mode range, the CMOS PECL-rx comprising:
    a decision stage for determining common mode input, the decision stage receiving an input differential voltage;
    an output buffer connected to said decision stage for receiving said input differential voltage in parallel to the decision stage according to a level of the common mode input determined by said decision stage and for providing an output from said PECL-rx; and
    biasing means connected to said output buffer for receiving differential input from the output buffer for determining the trip point voltage and connected to said decision stage for passing the trip point voltage to the decision stage for the decision stage to determine proper common mode input level of the output buffer.

7. An integrated circuit including a CMOS PECL-rx according to claim 6, wherein said biasing means comprises a dummy trip inverter connected by a negative feedback loop between said output buffer and said decision stage.

8. An integrated circuit including a CMOS PECL-rx according to claim 6, wherein said output buffer comprises:
    a complementary self-bias differential amplifier, said complementary self-bias differential amplifier further comprising two complementary self-bias differential amplifier inverters connected in parallel to each other.

9. An integrated circuit including a CMOS PECL-rx according to claim 8 wherein said biasing means comprises a dummy trip inverter, said dummy trip inverter comprising an inverter, said inverter having supplies connected in parallel to two complementary self-bias differential amplifier inverters.

* * * * *